United States Patent [19]

Van Loan et al.

[11] Patent Number: 5,270,641
[45] Date of Patent: Dec. 14, 1993

[54] DUAL SIDE ACCESS TEST FIXTURE

[75] Inventors: David R. Van Loan, Diamond Bar; Charles J. Johnston, Walnut; Mark A. Swart, Upland; David J. Wilkie, Claremont, all of Calif.

[73] Assignee: Everett Charles Technologies, Inc., Pomona, Calif.

[21] Appl. No.: 824,854

[22] Filed: Jan. 22, 1992

[51] Int. Cl.⁵ .................. G01R 31/02; G01R 1/073
[52] U.S. Cl. .................. 324/158 F; 324/158 P
[58] Field of Search .............. 324/158 P, 158 F, 72.5; 439/42, 482, 370, 372, 396, 345

[56] References Cited

U.S. PATENT DOCUMENTS

| | | | |
|---|---|---|---|
| 3,970,934 | 7/1976 | Aksu | 324/158 F |
| 4,160,207 | 7/1979 | Haines | 324/158 F |
| 4,357,062 | 11/1982 | Everett | 324/158 F |
| 4,417,204 | 11/1983 | Dehmel | 324/158 F |
| 4,744,770 | 5/1988 | Drogo | 439/310 |
| 4,812,754 | 3/1989 | Tracy et al. | 324/158 P |
| 4,842,542 | 6/1989 | Davis | 439/372 |
| 4,893,074 | 1/1990 | Holt et al. | 324/158 F |
| 4,899,104 | 2/1990 | Maelzer et al. | 324/158 F |
| 4,912,400 | 3/1990 | Plante | 324/158 F |
| 4,931,726 | 6/1990 | Kasukabe et al. | 324/158 P |
| 4,952,176 | 8/1990 | Koiner et al. | 439/372 |
| 5,087,878 | 2/1992 | Belmore, III et al. | 324/158 F |
| 5,109,596 | 5/1992 | Driller et al. | 324/158 P |

FOREIGN PATENT DOCUMENTS

| | | | |
|---|---|---|---|
| 3343274 | 6/1985 | Fed. Rep. of Germany | 324/158 F |
| 0098678 | 4/1990 | Japan | 324/158 F |
| 2038562 | 7/1980 | United Kingdom | 324/158 F |

Primary Examiner—Ernest F. Karlsen
Attorney, Agent, or Firm—Christie, Parker & Hale

[57] ABSTRACT

A dual side access test fixture tests circuits on both sides of a printed circuit board. The fixture includes a housing, a lower probe plate in the housing, an array of lower test probes in the lower probe plate for contacting the bottom of the board, an upper probe plate on the housing for moving to a closed position above the board, and an array of upper test probes in the upper probe plate for contacting an upper surface of the board when the upper probe plate closed. A plurality of system interface pins in the housing are electrically connected to the lower test probes. An external upper interface connector mounted over the closed upper probe plate has a plurality of contacts for connection to corresponding upper test probes. Flex cables contained within the upper interface connector conduct test signals from the upper test probes directly to an external electronic circuit tester. A first set of test signals is communicated from the lower test probes through the interface pins to the circuit tester. Separately, a second set of test signals is communicated from the upper test probes through contacts in the upper interface connector to the flex cables and to the circuit tester, via direct electrical connections which circumvent electrical feed-through connections within the interior of the vacuum fixture housing.

24 Claims, 8 Drawing Sheets

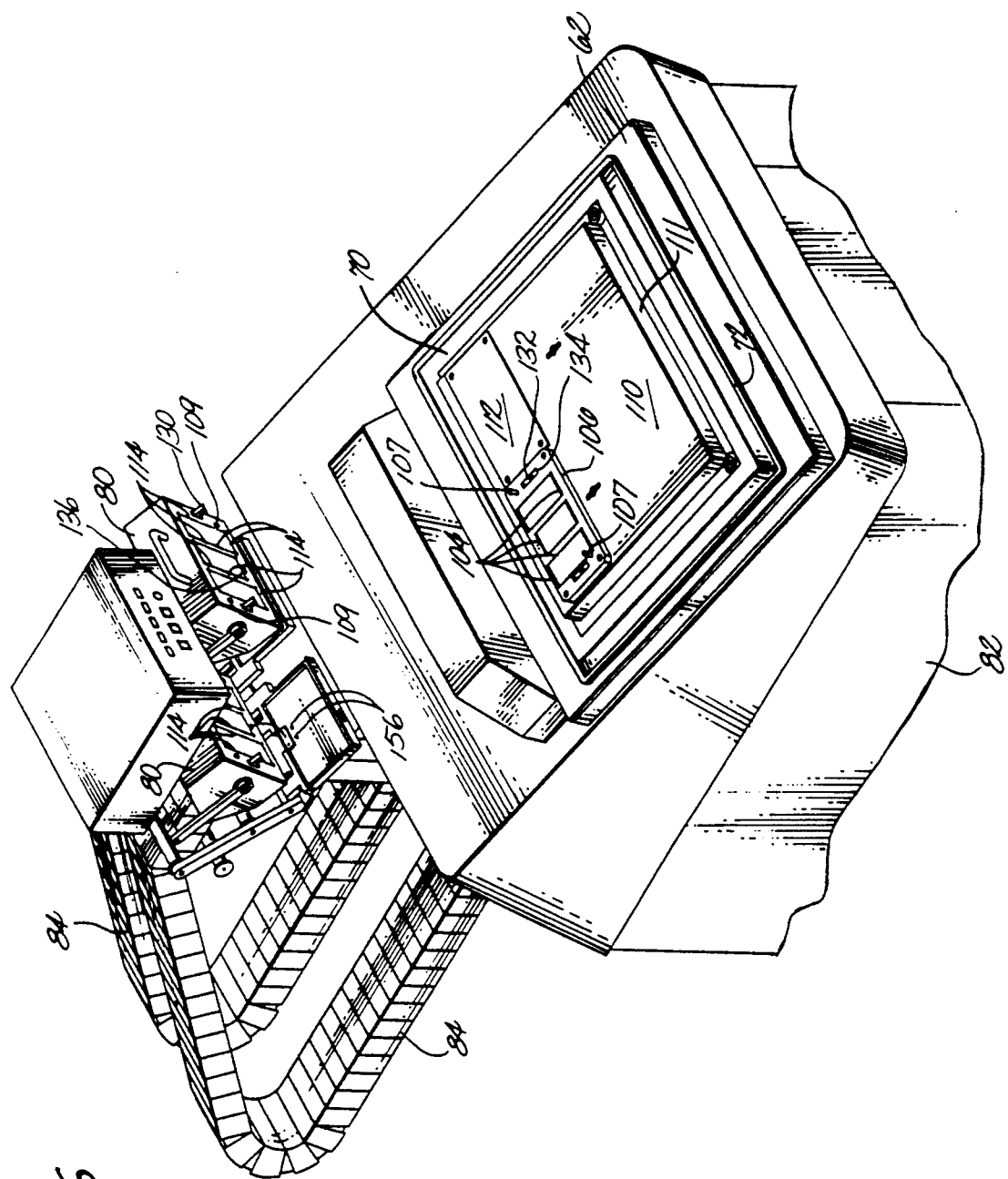

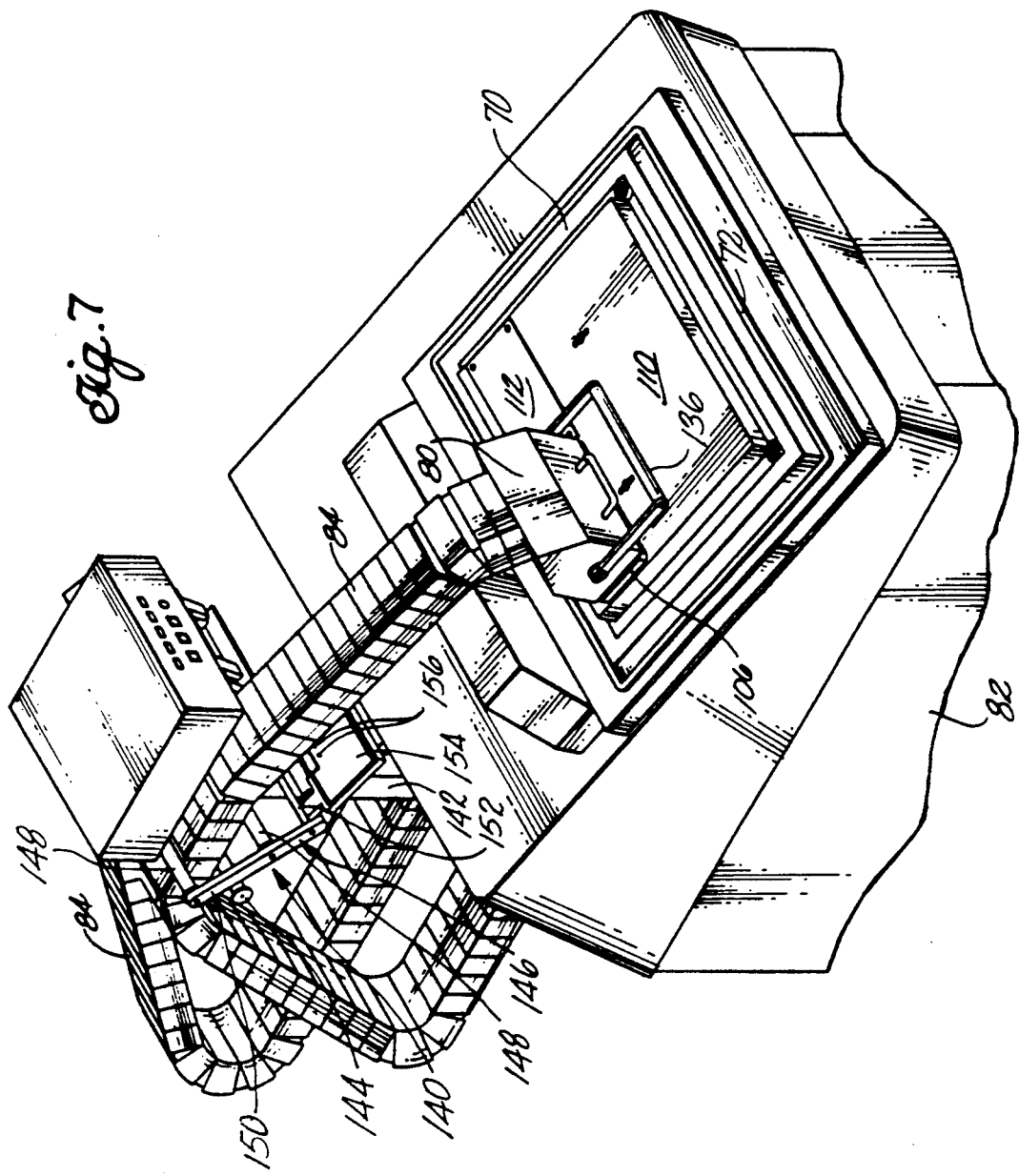

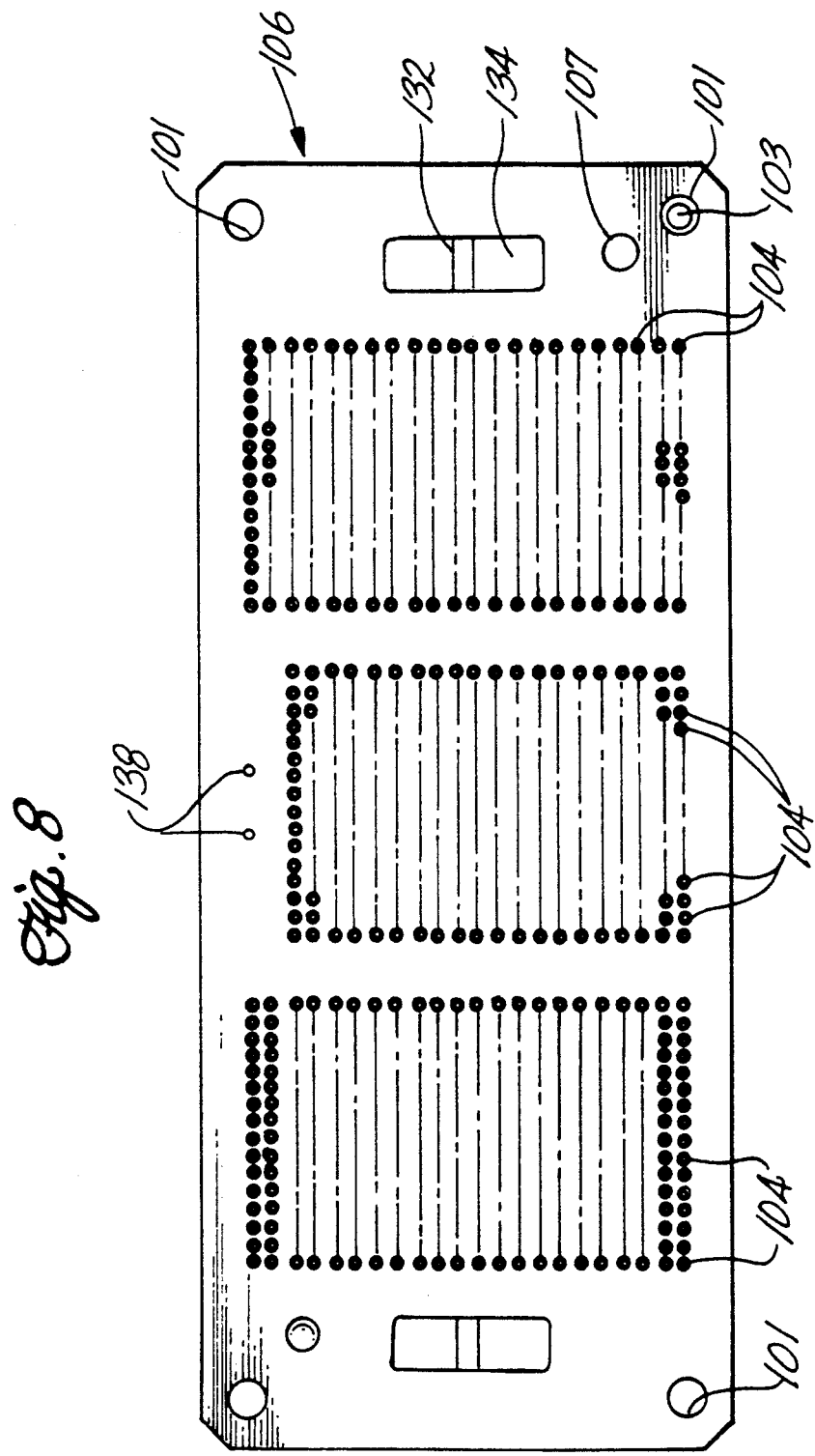

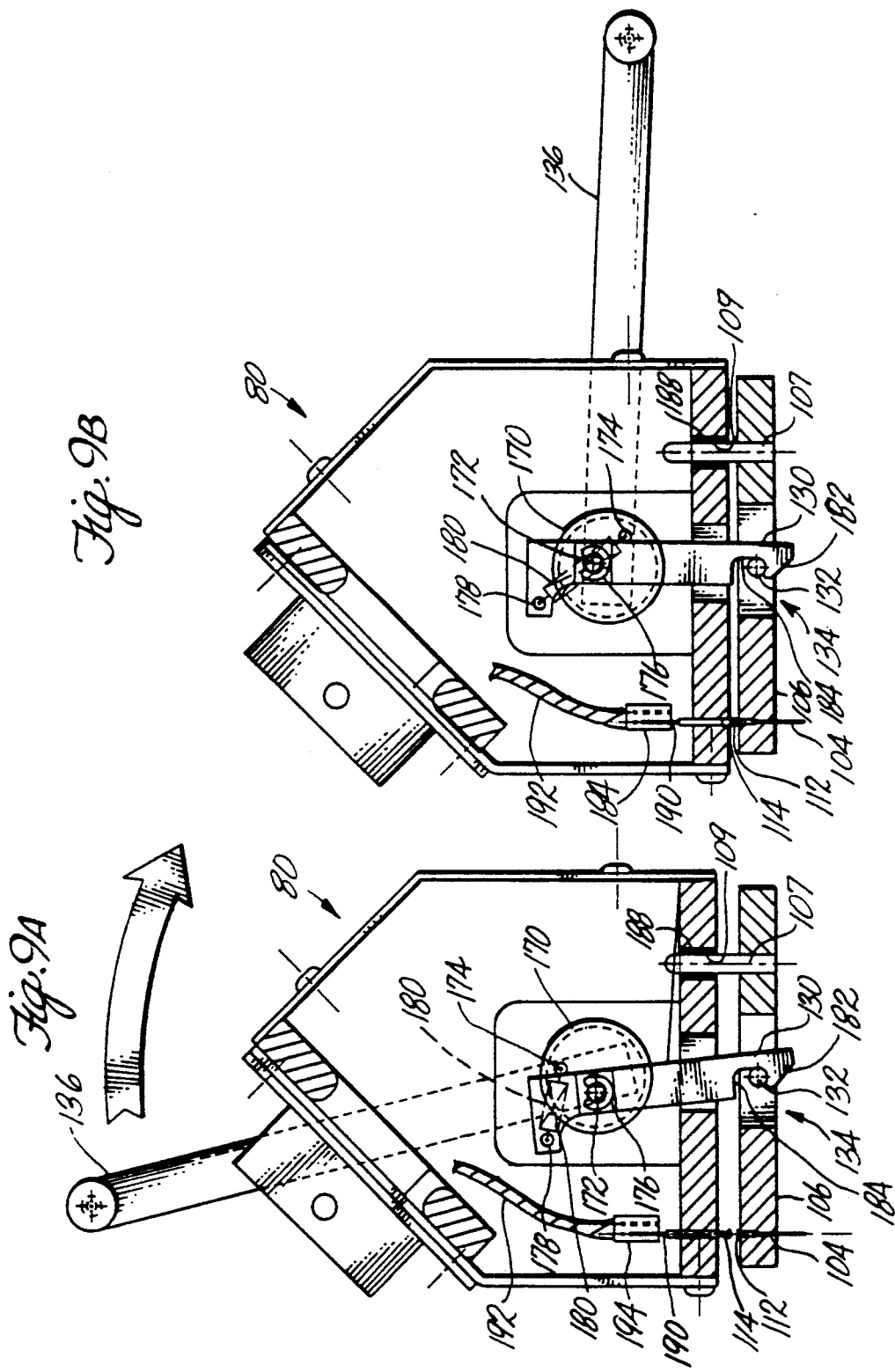

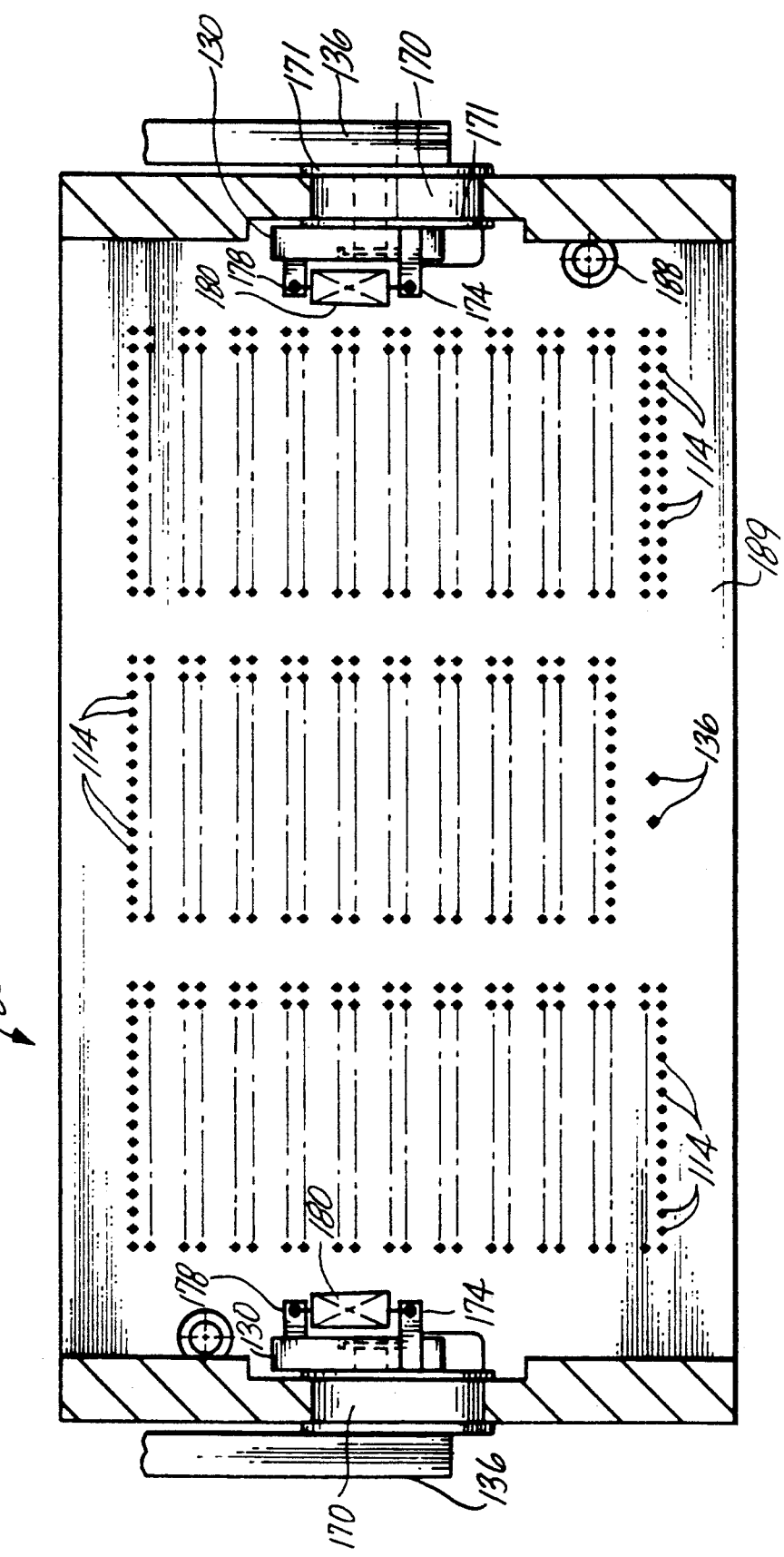

DUAL SIDE ACCESS TEST FIXTURE

FIELD OF THE INVENTION

This invention relates to the automatic testing of printed circuit boards, and more particularly, to a vacuum test fixture having improved dual side access for testing circuits printed on both sides of the board.

BACKGROUND OF THE INVENTION

Automatic test equipment for checking printed circuit boards has long involved use of a "bed of nails" test fixture to which the circuit board is mounted during testing. This test fixture includes a large number of nail-like, spring loaded test probes arranged to make electrical contact under spring pressure with designated test points on the circuit board under test. Any particular circuit laid out on a printed circuit board is likely to be different from other circuits, and consequently, the bed of nails arrangement for contacting test points in a particular circuit board must be customized for that circuit board. When the circuit to be tested is designed, a pattern of test points to be used in checking it is selected, and a corresponding array of test probes is configured in the test fixture. This typically involves drilling a pattern of holes in a probe plate to match the customized array of test probes and then mounting the test probes in the drilled holes on the probe plate. The circuit board is then mounted in the fixture, superimposed on the array of test probes. During testing, the spring loaded test probes are brought into spring pressure contact with the test points on the circuit board under test. Electrical test signals are then transferred from the board to the test probes and then to the exterior of the fixture for communication with a high speed electronic test analyzer which detects continuity or lack of continuity between various test points in the circuits on the board.

Various approaches have been used in the past for bringing the test probes and the circuit board under test into pressure contact for testing. One class of these fixtures is a wired test fixture in which the test probes are individually wired to separate interface contacts for use in transmitting test signals from the probes to the external electronically controlled test analyzer. These wired test fixtures are often referred to as "vacuum test fixtures" since a vacuum is applied to the interior of the test fixture housing during testing to compress the circuit board into contact with the test probes. A lid on the housing is closed over the test fixture to form a vacuum seal between the lid and the probe plate. A vacuum applied to the region between the lid and probe plate then moves the lid toward the probe plate, which compresses the circuit board between the lid and the probe plate. This applies spring pressure from the probes to the board. Customized wired test fixtures of similar construction also can be made by using mechanical means, other than vacuum, to apply the spring force necessary for compressing the board into contact with the probes during testing.

If the circuits on only one side of the printed circuit board are tested, the test probes in a wired test fixture are typically mounted in the probe plate below the board under test. It is common to connect the bottoms of the test probes to corresponding pins on separate interface blocks located at the periphery of the fixture housing below the circuit board. These connections are made by separate wires which are wire wrapped, crimped, soldered, or otherwise electrically connected to the bottoms of the probes and to corresponding interface pins. During testing, the system interface pins are forced into pressure contact with corresponding contacts in a test head receiver which is part of the base system. This receiver communicates the electrical test signals received from the probes and the interface pins to the external computer controlled electronic test analyzer.

When a two-sided board is tested by such prior art wired test fixtures, fixturing is more complex. The test signals pass from connections at the bottom of the fixture interface pins to the external tester in a manner similar to testing a single-sided board; the complexity arises in transferring signals from the upper side of the board to connections at the bottom interface pins. More specifically, the same arrangement of test probes mounted in the probe plate can be used for contacting the bottom of the circuit board, and the same wired connections are used for transferring the test signals to the interface pins, the receiver, and then to the electronic test analyzer. For testing the circuits on the upper face of the same board, an array of test probes is mounted on an upper probe plate in a pattern to match the pattern of test points in the circuits on the topside of the board. When the upper probe plate is closed, the upper test probes are aligned with the circuits on the upper surface of the board. Transfer pins are placed in areas on the upper probe plate outside the region covered by the board under test. These transfer pins are wired to corresponding upper test probes. Additional transfer pins are located in areas of the lower probe plate outside the region covered by the circuit board. The transfer pins on the upper probe plate make contact with corresponding transfer pins on the lower probe plate during testing. These lower transfer pins are wired to further corresponding interface pins on interface blocks in the lower portion of the fixture. When a vacuum is applied, test signals are communicated from the upper test probes to the upper transfer pins and through to the lower transfer pins and then on to the system interface pins and the contacts in the test head receiver and then to the electronic test analyzer.

The wire-wrapping or other connection of test probes, interface pins and transfer pins is time intensive. Substantial costs can be saved by reducing the number of wired connections used in making a customized wired test fixture. The present invention provides a test fixture having improved dual side access for testing circuits on both sides of the circuit board. The improvements reduce the number of wires and wired connections and also reduce the amount of spring probes used in the fixture when compared with the conventional prior art dual side fixture described above. These advantages are accomplished without added complexity to the receiver and electronic test system.

As mentioned previously, the customized wired test fixtures are one class of fixtures for transmitting test signals from the fixture to the external circuit tester; and more particularly, vacuum fixtures are one category of wired test fixtures. A further class of test fixtures is the so-called grid-type fixture in which the test points on both sides of a board are contacted by flexible pins which can move to contact the random pattern of test points on the board and transfer test signals to sets of interface pins arranged in a grid pattern in the receiver. In these grid-type testers, fixturing is generally less complex and simpler than in the customized wired test fixtures; but with a grid system, the grid interfaces and test electronics are substantially more complex and costly. It is the customized wired test fixtures to which the present invention is generally directed, and the resulting cost savings in fixturing can make this type of test system economically more attractive than the grid type system.

SUMMARY OF THE INVENTION

Briefly, this invention comprises a dual side access test fixture for use in the automatic testing of circuits on both sides of a printed circuit board. In one embodiment of the invention, which is adapted for use in a vacuum actuated wired test fixture, a circuit board is mounted to a lower probe plate of the fixture and an upper probe plate on the fixture housing is closed over the circuit board to form a vacuum seal between the upper probe plate and the lower probe plate. An array of lower test probes in the lower probe plate contact the lower face of the board. Separately, an array of upper test probes on the upper probe plate is adapted for contact with the upper face of the circuit board. When the upper probe plate is closed, and a vacuum is applied to the interior of the fixture housing, a vacuum formed between the upper and lower probe plates draws the upper and lower test probes into pressure contact with test points on the upper and lower faces of the circuit board, respectively. Electrical test signals are communicated from the lower test probes to separate lower interface pins at the periphery of the fixture housing and then to an electronic circuit tester outside the fixture housing. Separately, an external upper interface connector is mounted over the upper probe plate for transferring electrical signals from the upper test probes to the electronic circuit tester through interface pins in the upper interface connector. This provides a direct electrical connection to the external circuit tester independent of the test fixture housing, which circumvents the use of transfer pins and related wiring within the vacuum fixture.

By communicating test signals from the upper test probes, through the upper interface connector and directly to the electronic test analyzer, several advantages are provided. The prior art wired connections between the upper test probes and the upper transfer pins and between the lower transfer pins and the lower interface pins are avoided. The connections from the system interface pins to the receiver also are avoided. This reduces wiring steps and the number of probes required to construct the custom-made wired test fixture. Some of the wiring required in this arrangement can be made a permanent part of the test system and can thereby reduce the time required to make customized dual side access test fixtures. The invention also eliminates transfer pins from the upper and lower probe plates, which provides more area within the fixture that is usable for probing both sides of circuit boards than is provided by prior art dual side access test fixtures. This allows larger circuit boards to be tested on a fixture of a given size.

These improvements and other aspects of the invention will be more fully understood by referring to the following detailed description and the accompanying drawings.

BRIEF DESCRIPTION OF THE DRAWINGS

FIG. 6 is a fragmentary perspective view similar to FIG. 3 showing the upper probe plate of the test fixture in its closed position;

FIG. 7 is a fragmentary perspective view showing an upper interface connector in position over the upper probe plate for use in testing circuits on the upper surface of the circuit board;

FIG. 8 is a top elevation view illustrating principal components of a transfer block according to principles of this invention;

FIG. 9A is a semi-schematic cross-sectional view showing the interface connector mounted to the transfer block in a position of initial engagement;

FIG. 9B is a semi-schematic cross-sectional view similar to FIG. 9A but showing the upper interface connector mounted to the transfer block in a position of full engagement; and FIG. 10 is a semi-schematic elevational view showing a connector face of the upper interface connector.

DETAILED DESCRIPTION

Figure 1:
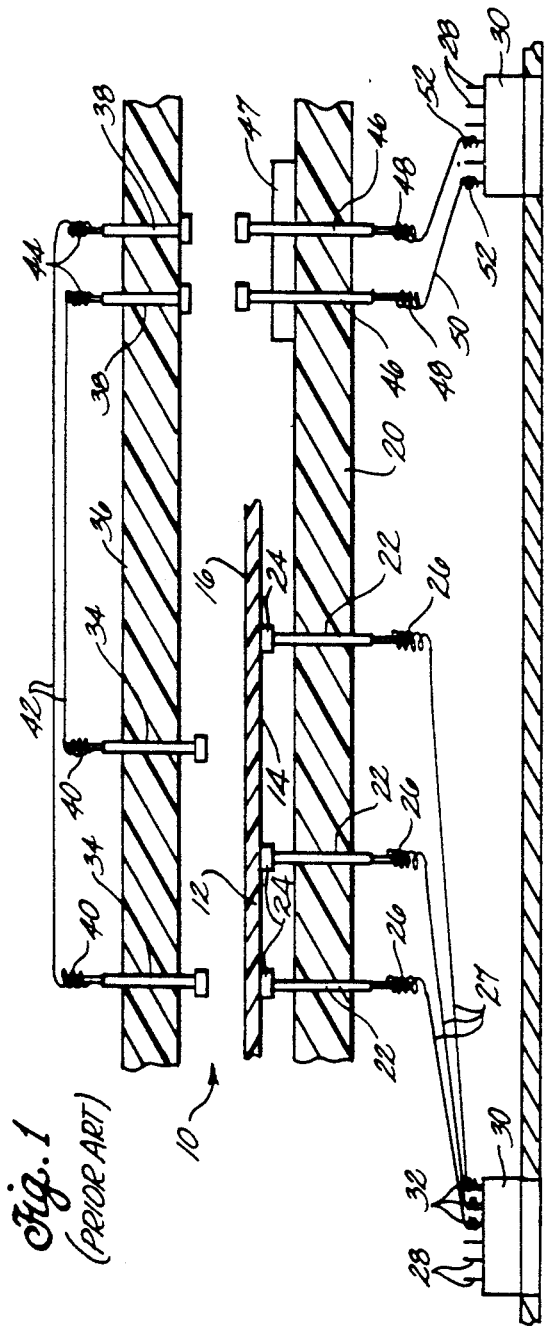
FIG. 1 is a fragmentary semi-schematic cross-sectional view illustrating principal components of a prior art dual side access test fixture.

FIG. 1 illustrates, by way of example, a conventional prior art dual access vacuum test fixture 10 for testing both sides of a printed circuit board 12. A circuit pattern under test is printed on a lower surface 14 of the board and a separate circuit pattern under test is printed on a upper surface 16 of the board. The circuit patterns contain test points to be monitored. The circuit board 12 rests on an array of lower test probes 22 mounted to the upper surface of a rigid lower probe plate 20. Tooling pins (not shown) accurately position the circuit board in a fixed position on the probe plate 20. The array of lower test probes 22 mounted in the probe plate 20 matches the pattern of test points in the circuits on the bottom of the board 12. (Only a few of the lower test probes, which can be several thousand in number, are shown for clarity. Components of the fixture are shown exaggerated in size or disproportionate in relative size also for clarity.) The lower spring probes typically comprise an outer receptacle, a compression spring disposed within the receptacle, and a spring biased probe 24 for making spring pressure contact with the circuits on the board. Terminals at the opposite ends of the spring probes are wire-wrapped at pins 26, and the individual wires 27 transfer electrical test signals from the lower test probes 22 to corresponding pins 28 on system interface blocks 30 mounted in the bottom of the fixture housing. Separate wire-wrap connections at pins 32 connect the wires 27 to the corresponding system interface pins 28. The interface pins 28 are arrayed on separate interface blocks 30 mounted in groups around the lower peripheral region of the housing interior. The interface pins 28 transfer test signals to the exterior of the test fixture housing.

In the prior art fixture shown in FIG. 1, the testing of circuits on the upper surface of the board is carried out by an array of upper test probes 34 carried in a movable upper probe plate 36 at the top of the fixture housing. The upper probe plate typically pivots between an open position and a closed position over the lower probe plate. In its closed position, the upper probe plate is sealed against the lower probe plate to form a vacuum chamber and to position the upper test probes 36 for alignment with test points in the circuits on the upper surface of the board 12. A seal between the upper probe plate and the lower probe plate, when the upper probe plate is closed, maintains the vacuum seal along with other sealing gaskets and elastomeric diaphragms or the like which are familiar to those skilled in the art. The upper test probes 34 can be similar to the lower test probes in that they comprise conventional spring probes for applying spring pressure to the test points in the circuit under test.

To communicate the signals from the upper test probes to an external high speed electronic circuit verifier, the test signals from the upper test probes 34 are typically communicated to the peripheral region of the vacuum housing by wire-wrap connections to an array of system interface pins (SIPS) 38 near the edge of the upper probe plate 36. These pins are also referred to herein as upper transfer pins. FIG. 1 illustrates a few of the upper test probes 34 and corresponding wire-wrap connections at pins 40 for communicating the electrical test signals from the upper test probes 34 through corresponding wires 42 to the upper transfer pins 38 via further wire-wrap connections at pins 44. Test signals from the transfer pins 38 at the edge of the upper probe plate are then communicated by spring pressure contact to corresponding spring biased lower transfer pins 46 mounted in the lower probe plate 20 below the upper transfer pins. The upper and lower transfer pins can be solid interface pins (SIPS) or spring probes similar to the test probes 22 and 34. (In practice, there are groups of upper transfer pins for contacting corresponding groups of lower transfer pins; only a few are illustrated for clarity.) Electrical test signals communicated from the upper transfer pins 38 to the lower transfer pins 46 are then communicated to corresponding contacts 28 on the system interface blocks 30 via separate wires 50. These connections are at pins 48 at the bottoms of the transfer pins 46 and corresponding wire-wrapped connections at pins 52 on the contacts 28 of the system interface blocks 30.

Thus, when a vacuum is applied to the prior art vacuum test fixture depicted in FIG. 1, the upper and lower test probes 34 and 22 are drawn into contact with the test points in the circuits on the upper and lower surfaces of the board 12, respectively. Test signals from the lower test probes are fed through the wires 27 to the system interface pins 28 at the periphery of the fixture, and test signals from the upper test probes 30 are fed by the wires 42 to the upper transfer pins 38. The vacuum applied to the interior of the fixture housing draws the transfer pins 38 into pressure contact with the spring biased lower transfer pins 46 simultaneously with the upper spring probes 34 being held in pressure contact with the test points on the upper face of the board under test.

Figure 2:
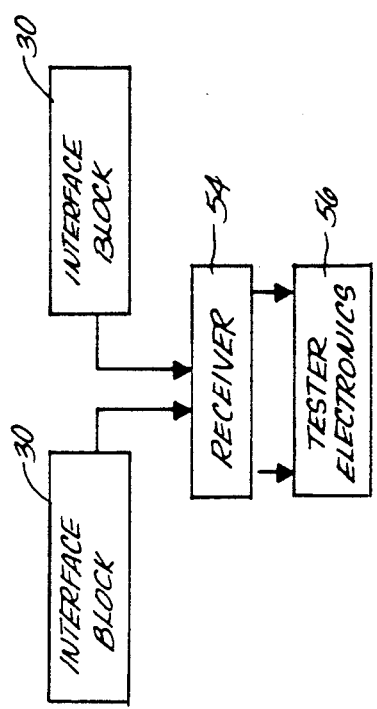
FIG. 2 is a schematic electrical block diagram showing the flow of electrical test signals in the prior art fixture, in which test signals from the upper side of the board are communicated by feed-through transfer pins to the exterior of the test fixture.

FIG. 2 illustrates a prior art test signal flow diagram for sending test signals from the arrays of upper and lower test probes in the fixture of FIG. 1 to an external computer-controlled circuit test verifier. In this prior art fixturing technique, the signals from the upper and lower test probes, which are communicated to the contacts 28 in the system interface blocks 30, are sent to a receiver 54 having electrical contacts (not shown) which are brought into spring pressure engagement with corresponding contacts 28 on the interface blocks 30 during testing. This transfers the signals from the fixture to the receiver which then passes the test signals to the tester electronics 56, typically a high speed computer-controlled test circuit verifier of a type well known to those skilled in the art.

FIGS. 3–10 illustrate a circuit board tester according to principles of this invention. The system illustrated in FIG. 3 includes a vacuum test fixture 60 having a lower probe plate 62. A printed circuit board 64 is shown mounted to an upper surface of the lower probe plate. Printed circuits 65 are shown on an upper surface of the board. Fixturing pins 66 guide the upper probe plate and align it to the lower probe plate when the fixture is closed. Vacuum holes 68 in the lower probe plate communicate with a vacuum cavity within the fixture housing below the support plate. An upper probe plate 70 rotates between an open position shown in FIG. 3 and a closed position shown in FIGS. 6 and 7. The upper probe plate has a bottom peripheral seal 72 for sealing to the top surface of the lower probe plate to maintain a vacuum seal within the interior of the fixture housing during testing. An array of upper test probes 74 mounted in the upper probe plate matches the configuration of test points in the circuits on the upper surface of the board under test. When the upper probe plate is closed, the fixturing pins 66 register with holes 76 in the upper probe plate to align the upper probe plate to the test fixture. Separate tooling pins 78 in the lower probe plate register with tooling pin holes in the printed circuit board under test for aligning the printed circuit board to the array of upper test probes and to the array of lower test probes (not shown) below the support plate.

Figure 3:
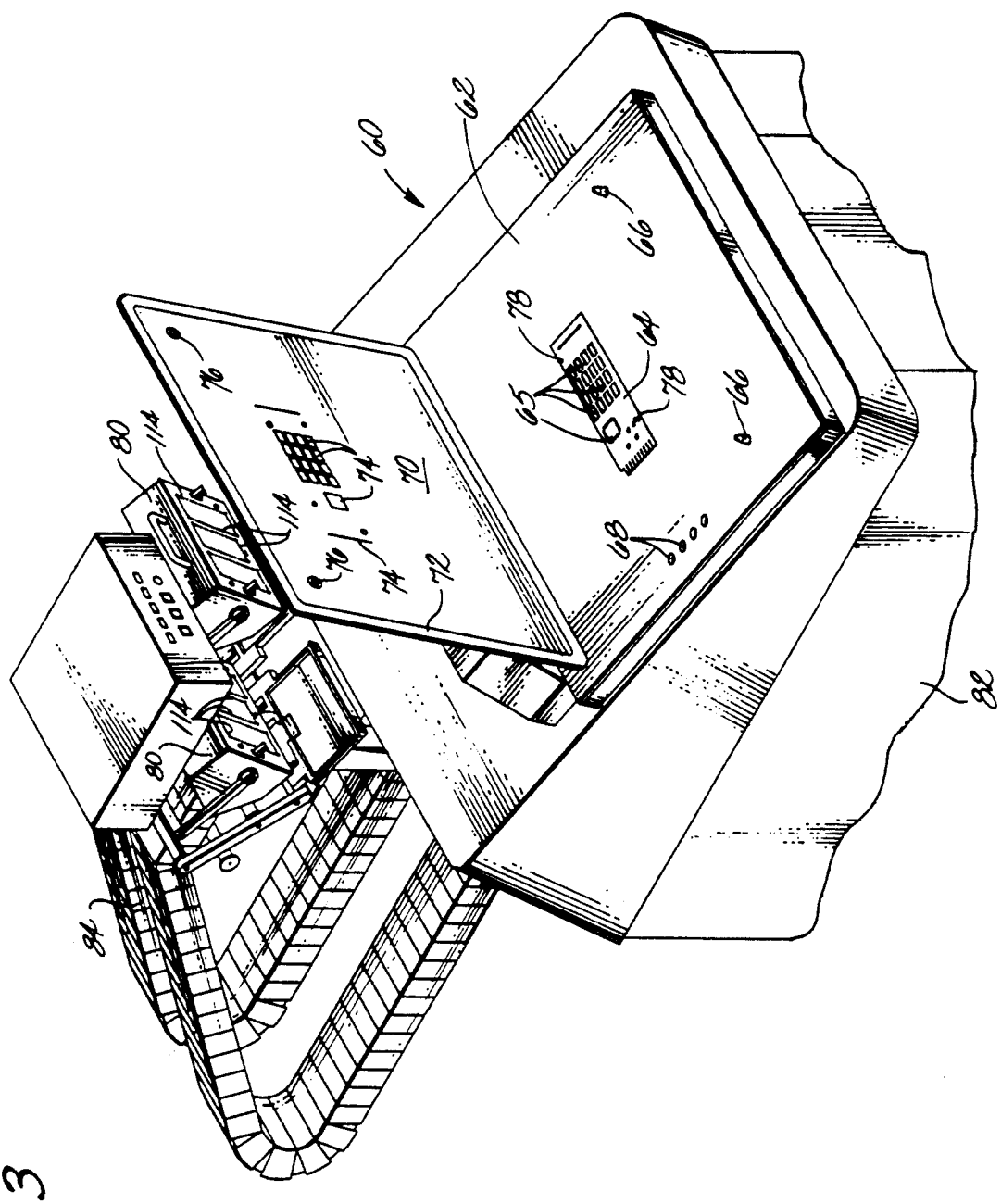
FIG. 3 is a fragmentary perspective view showing a dual side access test fixture of this invention in which an upper probe plate on the test fixture is shown in its open position exposing a circuit board under test.

The fixturing system illustrated in FIG. 3 can comprise an industry standard Series 32 dedicated fixture for accessing single or double sided conventional and SMT printed circuit boards. The present invention allows for improved means of access to and transfer of test signals from the upper side of the circuit board when testing both sides of the circuit board.

The test system illustrated in FIG. 3, apart from the fixturing system, includes a pair of separate upper interface connectors 80 for use in transferring electrical test signals from the array of upper test probes to a remote computer-controlled electronic test analyzer contained within a cabinet 82 below the fixture. In use, the upper interface connectors 80 are mounted over the upper probe plate, in its closed position. Test signals from the upper interface connectors 80 are communicated to the electronic test analyzer via separate flex circuit cables contained in separate articulated cable housings 84 connected between the upper interface connectors 80 and the circuitry within the external test analyzer.

Figure 4:
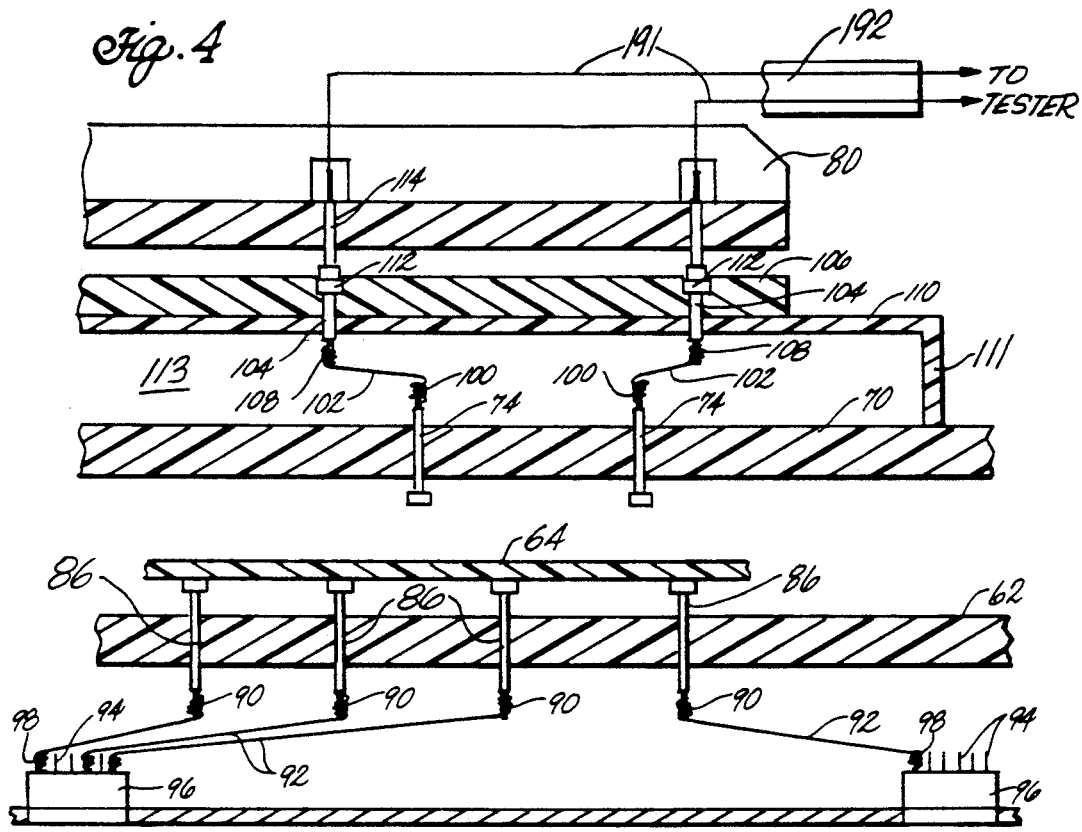
FIG. 4 is a fragmentary semi-schematic cross-sectional view illustrating principal components of a dual side access test fixture according to principles of this invention.

FIG. 4 is a semi-schematic cross-sectional view illustrating principal components of the dual side access test fixture of FIG. 3. The embodiment of the invention in FIG. 4 includes a vacuum housing with the necessary vacuum seals and gaskets, known to those skilled in the art, for forming a sealed vacuum cavity within the fixture housing. The vacuum cavity of this embodiment comprises the volume between the lower probe plate and the upper probe plate. A vacuum test fixture having components similar to the fixture disclosed in U.S. Pat. No. 4,138,186 to Long, et al. can be used for this purpose and is incorporated herein by this reference.

Certain components of the fixture assembly depicted in FIG. 4 are similar to the prior art fixture shown in FIG. 1, and these include an array of spring biased lower test probes 86 mounted in the lower probe plate 62 below the circuit board 64. The tooling pins 78 on the upper surface of the lower probe plate 62 (see FIG. 3) position the circuit board 64 to rest on the lower test probes 86. The bottoms of the lower test probes have wire-wrapped connections at pins 90 for communicating test signals from the lower test probes via separate wires 92 to corresponding pins 94 on system interface blocks 96 at the periphery of the vacuum fixture housing below the lower probe plate 62. Wire-wrapped connections 98 to the pins 94 on the system interface blocks 96 communicate the test signals from the separate wires 92.

FIG. 4 also illustrates the array of spring biased upper test probes 74 carried on the upper probe plate 70 that closes over the circuit board 64. As described in more detail below, the upper test probes 74 are wired to corresponding interface pins 104 mounted above the upper test probes. A rectangular cover plate 110 is mounted above the upper probe plate 70. A peripheral rim 111 extends around the bottom of the cover plate and projects down for resting on top of the upper probe plate 70. This forms a rectangular open space 113 between the inside of the cover and the top of the probe plate 70. The upper ends of the upper test probes 74 are wired to the interface pins 104 within the space 113. A vacuum is not drawn in the space 113 between the upper probe plate 70 and the cover 110, although the fixture could be designed to provide such a vacuum. As described previously, the upper test probes 74 are positioned in an array to match the test points in the circuits on the upper surface of the board 64. These test probes face downwardly toward the upper surface of the board 64, and when a vacuum is drawn within the interior of the fixture housing, the upper test probes 74 are forced into pressure contact with the circuits on the board 64. Terminal ends of the upper test probes are wire-wrapped at pins 100 and separate wires 102 communicate tests signals from the upper test probes to an array of corresponding system interface pins 104 (also referred to herein as transfer pins) mounted in a transfer block 106 affixed to the cover plate 110 which is positioned over the top of the upper probe plate 70. The system interface pins 104 are solid pins (SIPS) and the wires 102 from the upper test probes are wire-wrapped at pins 108 to the bottoms of the interface pins 104, within the space 113. These pins provide an array of fixed solid transfer pins arranged in a desired pattern within the transfer block 106 for communicating the test signals from the upper test probes 74 away from the vacuum test fixture and to corresponding circuit cables contained within the upper interface connector 80 referred to previously.

Referring briefly to FIG. 6, which shows the upper probe plate 70 in a closed position over the vacuum fixture housing, the cover plate 110 is shown mounted to the top of the upper probe plate on a side of the upper probe plate opposite from the vacuum cavity inside the fixture. The transfer block 106 is then mounted over the cover 110. FIG. 6 illustrates one transfer block 106 positioned on the cover, with an adjacent space 112 for mounting an additional separate transfer block if one is used. In the illustrated embodiment, only one transfer block is used and the adjacent space 112 is left unused. If a larger number of test probes are required for testing larger circuit boards, then an additional transfer block can be mounted in the space 112.

The system interface pins 104 are arrayed in a desired pattern in the transfer block as illustrated in FIG. 6 and in the enlarged view of the interface block shown in FIG. 8. As illustrated best in FIG. 4, the interface pins 104 extend through holes drilled in the cover 110, with the heads 112 of the interface pins facing upwardly from corresponding recessed openings in the upper surface of the transfer block 106.

Separate contacts in the form of spring biased test probes 114 are carried in a lower portion of each upper interface connector 80. FIGS. 3, 6 and 10 best illustrate the pattern of spring probes 114 in the upper interface connectors arranged to match the pattern of interface pins or transfer pins 104 in the transfer block 106.

Each upper interface connector 80 is arranged for mounting over a corresponding transfer block 106 so that the pattern of spring contacts 114 in the lower portion of the upper interface connector can be mechanically engaged with the heads 112 of the transfer pins 104 in the recessed regions above the pins in the transfer blocks 106. FIG. 6 illustrates the upper probe plate 70 and cover plate 110 of the vacuum fixture in their closed positions exposing the transfer pins 104 at the top of the transfer block 106.

The transfer block 106 is mounted to the cover plate 110 so that the transfer block is movable by a small amount relative to the upper probe plate 70 when the upper interface connector 80 is connected to the transfer block. Referring to FIG. 8, each transfer block 106 is mounted to the top of the cover plate 110 by bolts 103 extending through clearance holes 101 in the four corners of the transfer block. Each bolt 103 is captively mounted in and freely movable radially within its corresponding clearance hole 101, the holes being slightly oversized with respect to the bolts. The bolts 103 are engaged with corresponding nuts (not shown) which are tightened against the cover 110. The independent movement of the transfer block relative to the cover plate reduces the forces placed on the cover and the upper probe plate when the upper interface connector 80 is attached to the transfer block 106.

FIG. 7 illustrates the upper interface connector 80 mounted in its testing position above the transfer block. FIG. 9A is a semi-schematic cross-sectional view showing the upper interface connector 80 mounted to the transfer block 106 at initial engagement. FIG. 9B is a similar view showing the upper interface connector mounted to the transfer block during full engagement.

As shown in FIGS. 9A and 9B, a separate camming wheel 170 is mounted to each side wall of the upper interface connector 80 adjacent to a corresponding movable hook projecting from the bottom of the interface connector housing. Referring briefly to FIG. 10, each camming wheel is confined within the interface connector housing by a pair of oversized flanges or disks 171 at opposite ends of the wheel. Referring again to FIGS. 9A and 9B, the lever 136 is U-shaped with separate lever arms connected to corresponding camming wheels so that the wheels each rotate in unison with the lever as it rotates. A camming pin 172 is attached to a second side of the camming wheel and is offset from the center of the wheel. A support pin 174 is attached to the second side of the camming wheel and offset from the center of the wheel a radial distance greater than the offset of the camming pin 172. The support pin 174 is angularly offset from the camming pin 172. The support pin 174 is affixed to an arm of the lever 136 and is affixed at its opposite end to the cam wheel 170 so that the cam wheel rotates about an axis through the camming pin 172 when the lever is rotated manually.

The camming pin 172 is mounted to a movable hook 130. A c-clip 176 slid into a notch near the end of the camming pin holds the hook to the camming wheel. The hook has a support pin 178 extending outward from the hook and parallel to the support pin 174. A spring 180 is connected on one end to the support pin 174 and on the other end to the support pin 178.

When the upper interface connector is locked in position over the transfer block, the array of spring contacts 114 in the upper interface connector make spring pressure contact with the corresponding array of transfer pins 104 in the transfer block 106. To engage the upper interface connector 80 to the transfer block 106, the upper interface connector is first aligned adjacent to and opposite the corresponding transfer block 106 so that guide pins 107 in the transfer block are opposite alignment holes 109 in the interface connector. The alignment holes 109 contain bushings 188. The guide pins are located in opposite corners of the transfer block 106. The alignment holes are similarly located in opposite corners of the connector probe surface of the upper interface connector in an array corresponding to the guide pins. The upper interface connector 80 is moved towards the transfer block so that the guide pins 107 move into the alignment holes. The movable hooks 130 located on opposite sides of the upper interface connector engage corresponding bars 132 disposed in slots 134 in opposite ends of the transfer block 106. An end 182 of each hook is tapered so that each fixed bar 132 has a camming function when the hooks on the upper interface connector initially engage the bars on the transfer block. The tapered end of the hook has a notch 184. As the upper interface connector is moved toward the transfer block, the hook rotates in a counterclockwise direction, as oriented in FIG. 9A, stretching the spring 180. The tapered end 182 of the hook moves along the bar until the notch reaches the bar. At this point, the spring compresses and rotates the hook clockwise, causing the notch to engage the bar. This position is shown in FIG. 9A.

The fully engaged position of the upper interface connector is shown in FIG. 9B. Final electrical connection is achieved by rotating the lever 136 clockwise (as oriented in FIG. 9B) toward the cover 110. As the lever rotates, the camming wheel 170 correspondingly rotates, causing both the support pin 174 and the camming pin 172 to rotate. As the camming pin rotates, the hook 130 is moved upward and backward causing the upper interface connector to move downward and forward into contact with the transfer blocks. This aligns and engages the spring contacts 114 in the upper interface connector into the recessed regions of the heads 112 of the transfer pins 104 in the transfer block.

The upper interface connector 80 is disengaged from the transfer block by rotating the lever 136 backward and counterclockwise (as oriented in FIG. 9B), causing the camming wheel 170 to rotate beyond the initial engagement position shown in FIG. 9A. As the camming wheel rotates, the support pin 174 pushes the hook, thereby rotating the hook. The notch 104 in the hook moves away from the bar 132 on the transfer block, thereby releasing the hook. The upper interface connector is then lifted upward and away from the transfer block.

Rows and columns of the spring contacts 114 are arranged in the bottom face of the upper interface connector 80 in an array matching the corresponding pattern of transfer pins 104 in the transfer block 106. FIG. 10 illustrates an example of several arrays of the spring contacts 114 permanently mounted in and projecting through a fixed plate 189 in the bottom of the upper interface connector housing 80. The contacts 114 are spring probes well known to those skilled in the art. Referring to FIGS. 9A and 9B, each test probe 114 in the transfer block has a terminal 190 extending into the interior within the upper interface connector housing, above the fixed bottom support plate 189. The flex cables 192 each have a separate elongated plug-type connector 194 on one end. These connectors are electrically connected to the rows and columns of test probes 114 by plugging the connector of each flex cable to a corresponding row or column of multiple probe terminals 190. In the illustrated embodiment, side by side rows and columns of the cable connectors 194 are plugged into the arrays of terminals 190 on the contacts 104. For simplicity, one flex cable is shown in FIGS. 9A and 9B. The flex cables are ganged together within the upper interface connector housing and routed from the interior of the upper interface connector into and through the interior of the articulated cable housing 84.

Thus, the upper interface connector provides a means for connecting the upper test probes to the electronic circuit tester in a single step. The upper test probes can be arranged in any random pattern on the upper probe plate and this pattern of test probes is translated to a fixed preset pattern by the upper transfer pins. The contacts in the upper interface connector are arranged on a matching pattern and make spring pressure contact with the transfer pins in unison when the upper interface connector is latched to the transfer block. The upper interface connector and flex cables and the terminal block can be permanent parts of the test system which do not require customized wiring for each different fixture tested by the test system.

The articulated cable housings 84 protect the flex circuits 192 contained therein from damage and support the weight of the flex cables. Because large or high density circuit boards can have a large number of test points, a large number of flex circuit cables are required for connecting to the corresponding test probes. The flex circuit cables are heavy because of the large number of cables necessary for use when the upper interface connector is mounted to the upper probe plate. The weight of the flex cables can tend to pull the upper interface connector away from the upper probe plate if the cables are unsupported and hang over the side of the cabinet. This can cause the upper test probes to disengage from the circuit board, thereby breaking electrical continuity between the upper test probes and the test points on the circuit board. Conversely, if the flex circuit cables are supported so that they set their weight directly on the upper probe plate, the upper probe plate can be pushed into the circuit board. This excessive weight can cause the upper and lower test probes to exert a greater spring force against the test points on the circuit board and cause the circuit board to be damaged if this force is excessive. An uneven distribution of the weight against the circuit board also can deform either the upper probe plate or the circuit board. Thus, the invention provides a means for balancing the weight of the flex circuit cables to avoid these problems.

As shown in FIG. 7, the articulated cable housings 84 are supported by a cable support 140. The cable support 140 has a fixed vertical support post 142 attached to the cabinet 82 on one end and a second end projecting above the top surface of the cabinet. A balance rod 144 is mounted on the other end of the support post, approximately perpendicular to the support post and parallel to the edge of the cabinet. The balance rod is preferably made of polished metal so that the friction between the articulated housing 84 and the balance rod 144 allows smooth unimpeded movement of the cable housing as it slides across the rod. The articulated cable housing is looped over the balance rod so that the balance rod bears some of the weight of the housing and the flex cables resident within, to distribute the weight of the housing and cables on both sides of the balance rod (i.e., in front of and behind the rod). The placement of the balance rod is determined by the type of housing and the weight and length of the flex cables contained in the housing. Furthermore, the balance rod distributes the load from the weight of the cable among the cabinet, the balance rod, and the upper interface connector. The cable is balanced so that its weight does not pull the upper interface connector away from the upper probe plate or push the connector toward the upper probe plate.

When the upper interface connector is not in use, it is stowed in a holster 146 attached to the vertical support post 142. Two support bars 148 are disposed parallel to balance rod 144, with the support bars being located on opposite sides of the articulated cable housing 84. The support bars restrain the movement of the articulated cable housing 84, so that the cable housing will slide controllably across the balance rod 144 while the upper interface connector is being attached to the upper probe plate or stored in the holster 146. The support bars 148 are connected by a pair of parallel holding bars 150 mounted to each end of the support bars 148 to form a box-frame. A rest 152 is mounted between the holding bars 150, so that when the upper interface connector is placed into the holster, one side of the connector engages the rest. A cover 154 is mounted to the rest 152 so that the cover rotatably moves and exposes or covers the spring probe surface of the upper interface connector, when the upper interface connector is stowed in the holster.

Some tests detect high resistance shorts between adjacent circuit traces on the circuit board. In order to detect the low amperage currents that flow through these shorts, high voltage signals, typically about 250 volts, are applied to select test probes. Although the current of the supply voltages is low, it may cause physical injury to the fixture operator. Therefore, a safety interlock is provided to prevent the electronic test analyzer from applying the high voltage test signals unless the upper probe plate is properly closed and the upper interface connector is properly attached to the transfer blocks or properly stored in the holster if the upper interface connector is not being used.

Referring to FIGS. 6, 8 and 10, a safety interlock signal is applied to a contact pin 136 in the upper interface connector 80. The contact pin 136 is preferably identical to the spring biased test probes 114. Other types of contact pins however may be used. When the upper interface connector is attached to the transfer blocks on the upper probe plate, the contact pin 136 contacts a corresponding pin 138 in the transfer block. A safety interlock signal is then communicated from this pin to a second pin 138 in the transfer block through a wire connecting the two pins. The connection between the two pins and the transfer block may also be a cable or a strip of metal. The second pin 138 contacts a second contact pin 136 in the upper interface connector. When the connector is attached, the safety interlock signal is communicated from the first contact pin through the corresponding pin and the transfer block, through the wire through the second pin in the transfer block, and back to the electronic test analyzer through the second contact pin in the upper interface connector. This signal is only received at the electronic test analyzer when the upper interface connector is properly attached to the upper probe plate. If the safety interlock signal is received, the electronic test analyzer will allow the operator to run the electrical test. Otherwise the electronic test analyzer will not apply high voltage test signals to the test fixture and turns on a warning light informing the operator that the upper interface connector is not properly attached.

In some configurations of the test fixture, multiple upper interface connectors are provided. However, some circuit boards may require the use of only one upper interface connector, because the number of test points on the circuit board is sufficiently small. Although the second upper interface connector does not require electrical test signals, a second safety interlock is provided. When the upper interface connector is stored in the holster, the contact pins 136 in the upper interface connector contact corresponding pins 156 on the cover 154. In a manner similar to the safety interlock discussed above, the electronic test analyzer will apply the safety interlock signal to the contact pin 136 of the unused upper interface connector. This signal is communicated from the contact pin 136 to the corresponding pin 154 which is electrically connected by a strip of metal (not shown) in the cover. The safety interlock signal is then communicated from the second pin 154 to the corresponding contact pin 136 and back to the electronic test analyzer. Although the electronic test analyzer will not apply high voltage to an unused upper interface connector, a safety interlock of the holster provides an additional safeguard against accidental application of high power.

In operating the test fixture of this invention, the desired array of transfer pins 104 is preset in the transfer block 106, and the transfer block is mounted to the upper surface of the cover 70. The bottoms of the transfer pins are wire-wrapped to corresponding upper test probes 74 in the upper probe plate of the fixture, within the interior of the cover 70. The upper interface connector 80 is then positioned over the transfer block and moved to a locked position on the transfer block. This mechanically applies spring pressure between the contacts 114 in the upper interface connector and the transfer pins 104 in the transfer block leading to the upper test probes. When the necessary vacuum seals are produced, a vacuum is applied to the interior of the fixture which draws the upper or lower test probes into contact with corresponding sides of the board under test. Test signals are conducted from the wire-wrapped connections at the bottoms of the lower test probes 86 to the interface pins 94 on the system interface blocks 96 in the lower peripheral portion of the vacuum housing. Separately, test signals from the upper test probes 74 are communicated to the interior of the upper interface connector and then to separate conductive circuit traces 191 on the flex cables 192 contained within the articulated cable housings 84. These test signals are communicated to the electronic test analyzer separately from any connections to system interface pins within the vacuum test fixture.

Figure 5:
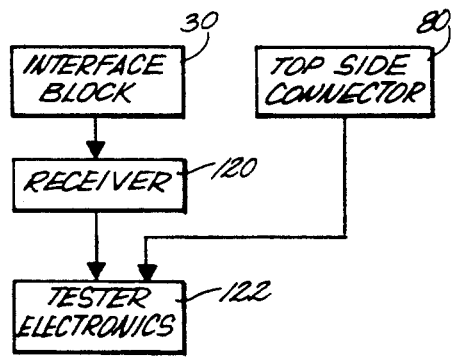
FIG. 5 is a schematic electrical block diagram illustrating the flow of test signals from the upper and lower sides of the circuit board to an external test analyzer in the fixture of FIG. 4.

FIG. 5 illustrates the flow of test signals from the circuit board tester of this invention. The test signals for the lower test probes are communicated to the interface blocks and then sent to a receiver 120 via spring probe contact with corresponding pin connectors in the receiver. The test signals are then sent from the receiver to the computer-controlled test analyzer 122. Separately, the test signals from the upper test probes are communicated to the topside interface connector 80 and then circumvent the interface blocks and the vacuum test fixture and are connected by direct electrical connection from the flex cable 118 to the computer-controlled electronic test circuit analyzer 122.

By providing a direct electrical connection from the test head to the electronic test analyzer, improvements are provided over the prior art tester illustrated in FIGS. and 2. For instance, fewer wire-wrapped connections are used, which reduces the time required to manufacture the customized test fixture. In addition, fewer spring probes are required and standard interface pins are used in their place, which provides further cost savings. By communicating the test signals from the upper test probes to the electronic test verifier by a direct electrical connection that circumvents the vacuum test fixture, the upper transfer pins 38 and lower transfer pins 46 of the prior art are avoided. By eliminating these connections from the interior of the vacuum test fixture housing, more space is available within the vacuum housing for the use of more test probes for testing a greater number of test points in larger circuit boards. Elimination of the extra contact points between sets of transfer pins improves reliability of the electronic interconnections and thereby improves the reliability of the test being performed. In addition, the upper interface connector can make all connections to the top side of the board in one step. Mechanical stresses on the fixture are avoided when the interface connector is latched in place during testing, and the weight of the interface connector is balanced to avoid undue forces applied to the fixture during testing. The upper interface connector system, including the flex cables and transfer block, are permanent parts of the system, which reduces fixturing costs.

What is claimed is:

1. A dual side access test fixture for use in the automatic testing of circuits on both sides of a printed circuit board, in which the fixture is electrically connected to an external electronic circuit tester for performing high speed testing of the circuits on the board, and in which the circuit tester has electronic circuit board verification circuits tester has electronic circuit board verification circuits contained external to and spaced remotely from a fixture housing containing a circuit board under test, the fixture comprising:

a housing for containing a circuit board under test;

a lower probe plate in the housing for supporting the circuit board above the lower probe plate;

an array of lower test probes disposed in the lower probe plate for access to a lower surface of the circuit board;

an upper probe plate on the housing for moving to a closed position above the circuit board;

an array of upper test probes disposed in the upper probe plate for access to an upper surface of the circuit board when the upper probe plate is closed, thereby forming a closed position of the housing;

a plurality of system interface pins in the housing for electrical connection to corresponding lower test probes and the circuits in the external electronic circuit tester;

an upper interface connector having a pattern of fixed electrical contacts carried on an adapter head external to the closed fixture housing and connected to the free end of flexible cabling extending outside the closed fixture housing from the circuits contained in the external electronic circuit tester to the fixed contacts on the adapter head, the adapter head and flexible cabling being movable in unison independently of the closed fixture housing and the electronic circuit tester, for communicating electrical test signals from the pattern of fixed contacts directly to the external electronic circuit tester independently of and to the exterior of the closed fixture housing;

connector means carried on the adapter head for releasably connecting to corresponding connector means on the exterior of the housing for thereby releasably connecting the pattern of fixed contacts carried on the adapter head to a fixed position above the upper probe plate for forming, in unison, separate electrical connections between the fixed contacts thereon and corresponding upper test probes, independently of contact between the upper and lower test probes and the board under test; and actuating means for bringing the upper and lower test probes into pressure contact with circuits on the upper and lower surfaces of the board, respectively, when the housing is closed and said electrical connections have been formed by said connector means, to communicate electrical test signals from the lower test probes through the system interface pins and to the electronic circuit tester, and to separately communicate electrical test signals from the upper test probes through the fixed contacts in the upper interface connector and to the electronic circuit tester independently of and to the exterior of the closed fixture housing.

2. Apparatus according to claim 1, including an elongated flexible sheath secured to the adapter head and containing the flexible cabling and extending from the upper interface connector around the outside of the closed fixture housing to the external electronic circuit tester.

3. Apparatus according to claim 1, including a transfer block mounted in a fixed position over the upper probe plate on the exterior of the closed fixture housing, and an array of transfer pins in the transfer block separately wired to the upper test probes and aligned with corresponding fixed contacts in the upper interface connector, in unison, when the upper interface connector is releasably mounted over the transfer block, for communicating the electrical test signals from the upper test probes to the fixed contacts on the upper interface connector.

4. Apparatus according to claim 3, in which the connector means on the adapter head comprise releasable locking means, and in which said cooperating connector means on the housing comprise locking means on the transfer block for cooperating with the locking means on the head to secure the adapter head in a fixed position locked to the transfer block and aligning the fixed contacts of the interface connector in pressure contact with corresponding transfer pins in the transfer block.

5. Apparatus of claim 4, in which the transfer block is mounted over the upper probe plate so that the transfer block has a limited freedom of movement independent of the upper probe plate when the upper interface connector is locked to the transfer block.

6. Apparatus according to claim 2, including means for supporting the weight of the sheath containing the flexible cabling to control the force applied by the weight of the cabling, the sheath and the upper interface connector to the top of the closed fixture housing.

7. A dual side access test fixture for use in the automatic testing of circuits on both sides of a printed circuit board, in which the fixture is electrically connected to an external electronic circuit tester for performing high speed testing of the circuits on the board, and in which the circuit tester has electronic circuit board verification circuits contained external to and spaced remotely from the fixture housing containing the board under test, the fixture comprising:
   a housing for containing a circuit board under test;
   a lower probe plate in the housing for supporting the circuit board above the lower probe plate;
   an array of lower test probes disposed in the lower probe plate for access to a lower surface of the circuit board;
   an upper probe plate on the housing for moving to a closed position above the circuit board;
   an array of upper test probes disposed in the upper probe plate for access to an upper surface of the circuit board when the upper probe plate is closed, thereby forming a closed position of the housing;
   an upper interface connector outside the closed fixture housing for mounting over the upper probe plate in its closed position, the upper interface connector containing a pattern of contacts carried on an adapter head external to the closed fixture housing and connected to the free end of flexible cabling extending outside the closed fixture housing from the circuits contained in the external electronic circuit tester to the contacts on the adapter head, the adapter head and its flexible cabling being movable in unison independently of the closed fixture housing and the electronic circuit tester, for electrical connection of the contacts in unison to a corresponding pattern of transfer pins exposed above the upper probe plate and wired to respective upper test probes in the closed fixture housing;
   locking means carried on the adapter head for releasably locking the adapter head to a fixed position above the upper probe plate to thereby releasably engage the pattern of contacts thereon with the pattern of transfer pins in unison, independently of contact between the upper and lower test probes and the board under test; and
   actuating means for brining the upper and lower test probes into pressure contact with circuits on the upper and lower surfaces of the board, respectively, when the housing is closed, to communicate electrical test signals from the lower test probes to the electronic circuit tester, and to separately communicate electrical test signals from the upper test probes to the transfer pins and through the contacts in the upper interface connector, through the flexible cabling and to the electronic circuit tester, independently of and to the exterior of the closed fixture housing.

8. Apparatus according to claim 7, in which the adapter head includes an elongated flexible sheath secured to the adapter head and containing said flexible cabling and extending from the upper interface connector, around the outside of the closed fixture housing and to the external electronic circuit tester.

9. Apparatus according to claim 7, in which the contacts in the upper interface connector comprise an array of spring contacts; and including a transfer block for mounting over the upper probe plate and the upper test probes, the pattern of transfer pins being positioned in the transfer block and separately wired to the upper test probes, the contacts on the upper interface connector being aligned with and in and spring pressure contact with corresponding transfer pins, the contacts in the upper interface connector being connected to terminals on the flexible cabling carried by the interface connector for communicating electrical signals from the spring contacts to circuits in the electronic circuit tester independently of an to the exterior of the fixture housing.

10. Apparatus according to claim 9, wherein the locking means includes means for releasably latching the adapter head to the transfer block for automatically connecting the pattern of contacts thereon to the transfer pins.

11. Apparatus according to claim 10 in which the transfer block is mounted over the upper probe plate so the transfer block has a limited freedom of movement independently of the upper probe plate when the upper interface connector is latched to the transfer block.

12. Apparatus according to claim 7 in which the flexible cabling is contained within a common flexible sheath, and including means for supporting the weight of the cable sheath to control the force applied by the weight of the cable sheath, the cabling, and the adapter head to the top of the closed fixture housing.

13. A dual side access test fixture for use in the automatic testing of circuits on both sides of a printed circuit board, in which the fixture is electrically connected to an external electronic circuit tester for performing high speed testing of circuits on the board, and in which the circuit tester has electronic circuit board verification circuits contained external to and spaced remotely from the fixture housing containing the board under test, the fixture comprising:
   a housing having a hollow interior for containing a circuit board under test;
   a lower probe plate in the housing for supporting a circuit board above the lower probe plate;
   an array of lower test probes disposed in the lower probe plate for access to a lower surface of the circuit board;

an upper probe plate on the housing for moving to a closed position above the circuit board;

an array of upper test probes disposed in the upper probe plate for access to an upper surface of the circuit board when the upper probe plate is closed, thereby forming a closed position of the housing;

an upper interface connector for mounting over the upper probe plate in its closed position, the upper interface connector carried on an adapter head external to the closed fixture housing and containing a pattern of contacts for electrical connection to corresponding upper test probes, the upper interface connector and its adapter head being carried on an elongated flexible tubular outer sheath extending from the adapter head to the circuit tester independently of and to the exterior of the closed fixture housing, said flexible sheath containing one or more flexible electrical cables electrically connected from the contacts on the interface connector directly to the circuits within the circuit tester independently of the closed fixture housing, the adapter head, the flexible cables and the outer sheath being movable in unison independently of the closed fixture housing and the electronic circuit tester;

means for releasably locking the movable adapter head of the upper interface connector to corresponding locking means on the exterior of the housing for thereby releasably connecting the pattern of contacts carried on the adapter head to a fixed position above the closed upper probe plate independently of contact between the upper and lower test probes and the board under test, for communicating electrical signals, in unison, between the contacts on the interface connector and the upper test probes; and actuating means for applying a vacuum to the interior of the closed fixture housing so that the applied vacuum draws the arrays of upper and lower test probes into pressure contact with upper and lower surfaces of the circuit board for testing;

a first set of electrical test signals being communicated from the lower test probes and to the electronic circuit tester when said vacuum is applied; and a second set of electrical test signals being separately communicated from the upper test probes through the contacts in the external upper interface connector and to the electronic circuit tester via a direct electrical connection through the flexible cables which circumvents the vacuum area formed within the interior of the closed fixture housing.

14. Apparatus according to claim 13, including a transfer block outside the closed fixture housing for mounting over the upper probe plate and over the upper test probes, and an array of transfer pins in the transfer block separately wired to the upper interface connector, the locking means causing releasable spring biased pressure contact between the transfer pins and the contacts in the interface connector.

15. Apparatus according to claim 14 in which the adapter head has a first locking means for cooperating with a second locking means on the transfer block to secure the adapter head in a fixed position locked to the transfer block and aligning the contacts of the interface connector in pressure contact with corresponding transfer pins in the transfer block.

16. Apparatus according to claim 15 in which the transfer block is mounted over the upper probe plate so the transfer block has a limited freedom of movement independently of the upper probe plate when the upper interface connector is latched to the transfer block.

17. Apparatus according to claim 13, including a plurality of said flexible electrical cable each connected releasably from a plurality of the transfer pins on the upper interface connector to circuits in the electronic circuit tester, independently of the vacuum formed in the closed fixture housing.

18. Apparatus according to claim 17, including a balancing device disposed external of the fixture for supporting the weight of the flexible tubular sheath containing said flexible cables to control the force applied to the test fixture by the weight of the adapter head, the interface connector and the cables when the locking means locks the adapter head of the interface connector in said fixed position.

19. A dual side access test fixture for use in the automatic testing of circuits on both sides of a printed circuit board, in which the fixture is electrically connected to an external electronic circuit tester for performing high speed testing of circuits on the board, and in which the circuit tester has electronic circuit board verification circuits contained external to and spaced remotely from the fixture housing containing the board under test, the fixture comprising:

means for mounting a printed circuit board within a test fixture housing, in which an upper probe plate is closed over the circuit board mounted in the fixture housing;

the fixture housing having an array of lower test probes for contact with a lower face of the board;

the upper probe plate having an array of upper test probes for contact with an upper face of the board when the upper probe plate is closed, thereby forming a closed position of the housing;

means for applying pressure within the housing below the closed upper probe plate so that said pressure forces the upper and lower test probes into contact with the upper and lower faces of the board;

means for communicating electrical test signals from the lower test probes to the electronic circuit tester when said pressure is applied to the fixture housing; and an upper interface connector external to the closed fixture housing for mounting over the upper probe plate in its closed position for communicating electrical test signals from the upper test probes to the electronic circuit tester through a direct electrical connection thereto independently of and to the exterior of the pressure applied beneath the closed upper probe plate on the fixture housing, the upper interface connector including a locking mechanism for engaging a cooperating locking means on the exterior of the fixture housing to hold the interface connector in a fixed position over the upper probe plate, and a pattern of contacts within the upper interface connector for alignment with and for making releasable contact with a corresponding pattern of transfer pins on the closed fixture housing when the locking mechanism is engaged, said releasable contact being made independently of contact between the upper and lower test probes and the board under test, in which the test signals sent from the upper test probes are sent to the test signals sent from the upper test probes are sent to the test circuits in the electronic circuit tester via electrical communication from the upper test probes to the transfer pins, to the contacts, and then to connections from the contacts directly to the circuit tester, independently of and to the exterior of the closed fixture housing, the upper interface connector being carried on an elongated tubular flexible sheath containing therein electrical cabling coupled to the pattern of contacts on the interface connector for transmitting the test signals from the contacts to the test circuits in the remotely located electronic circuit tester, said electrical cabling and its outer sheath being movable in unison to plate the interface connector in a position over the upper probe plate for making said releasable contact with the transfer pins.

20. Apparatus according to claim 19, including a balancing device disposed external to the closed fixture housing for supporting the weight of the flexible sheath containing said cabling to control the force applied to the test fixture by the weight of the interface connector, its cabling and the sheath when the locking means is engaged.

21. Apparatus according to claim 19 in which the upper interface connector has a first locking means for cooperating with a second locking means on the fixture housing to secure the interface connector in a fixed locked position aligning the contacts of the interface connector in pressure contact with corresponding transfer pins on the fixture housing.

22. Apparatus according to claim 21 in which the locked interface connector has a limited freedom of movement relative to the fixture housing independent of the upper probe plate.

23. A process for performing dual side access electrical testing of both sides of a printed circuit board in a test fixture electrically connected to an electronic circuit tester for performing high speed testing of circuits on the board, the circuit tester having electronic circuit board verification circuits contained external to and spaced remotely from the fixture housing containing the board under test, the process comprising:
mounting a printed circuit board within a vacuum housing of the test fixture;
closing an upper probe plate on the fixture over the circuit board mounted in the vacuum housing;
positioning an array of lower test probes in the vacuum housing for contact with a lower face of the board;
positioning an array of upper test probes in an upper probe plate for contact with an upper face of the board when the upper probe plate is closed to seal a vacuum in the housing;
applying a vacuum to a space within the housing interior below the closed upper probe plate so that said vacuum draws the upper and lower test probes into contact with the upper and lower faces of the board;
communicating electrical test signals from the lower test probes to the electronic circuit tester when the vacuum is applied to the interior of the closed fixture housing;
providing a movable upper interface connector having a pattern of electrical contacts communicating with flexible cabling extending through an elongated movable tubular flexible sheath carried by the upper interface connector and extending to the remote electronic circuit tester outside of the closed fixture housing;
positioning the movable upper interface connector over the upper probe plate in its closed position and releasably latching the interface connector over the upper probe plate and outside the closed fixture housing, the upper interface connector being releasably latched independently of contact between the upper and lower test probes and the board under test;
the step of latching the interface connector over the upper probe plate causing electrical test signals to be communicated from the upper test probes to the electrical contacts within the latched upper interface connector and communicating the electrical test signals directly from the contacts in the upper interface connector to the electronic circuit tester via the electrical cabling inside the elongated external cable sheath extending to the circuit tester outside of and independently of the vacuum applied to the vacuum test fixture.

24. A dual side access test fixture for use in the automatic testing of circuits on both sides of a printed circuit board, in which the fixture is electrically connected to an external electronic circuit tester for performing high speed testing of the circuits on the board, the fixture comprising:
a housing;
a lower probe plate in the housing for supporting a circuit board above the lower probe plate;
an array of lower test probes disposed in the lower probe plate for access to a lower surface of the circuit board;
a plurality of system interface pins in the housing for electrical connection to corresponding lower test probes;
an upper interface connector having a pattern of fixed electrical contacts for communicating electrical test signals from the pattern of fixed contacts directly to the external circuit tester independently of the fixture housing and a second plurality of contacts for electrical connections to corresponding upper test probes on the closed upper probe plate;
an upper probe plate on the housing for moving to a closed position above the circuit board, the upper probe plate having means for electrically connecting each test probe of one of a first group in the second plurality to a corresponding test probe in a second group in the second plurality of contacts;
an array of upper test probes disposed in the upper probe plate for access to an upper surface of the circuit board when the upper probe plate is closed;
means on the upper interface connector for releasably connecting the pattern of contacts thereon to a fixed position above the upper probe plate for forming, in unison, separate electrical connections between the contacts thereon and the upper test probes;
means for bringing the upper and lower test probes into pressure contact with circuits on the upper and lower surfaces of the board to communicate electrical test signals from the lower test probes through the system interface pins and to the electronic circuit tester, and to separately communicate electrical test signals from the upper test probes through the contacts in the upper interface connector and to the electronic circuit tester independently of the fixture housing;
means for applying safety interlock signals to the first group of contacts; and
means for detecting safety interlock signals on the second group of contacts.

* * * * *

UNITED STATES PATENT AND TRADEMARK OFFICE
CERTIFICATE OF CORRECTION

PATENT NO. : 5,270,641

DATED : December 14, 1993

INVENTOR(S) : David R. Van Loan; Charles J. Johnston; Mark A. Swart; David J. Wilkie It is certified that error appears in the above-indentified patent and that said Letters Patent is hereby corrected as shown below:

Abstract, line 19, after "tester." insert -- A vacuum applied to the interior of the housing draws the upper or lower arrays of test probes into pressure contact with both sides of the circuit board during testing. --

Column 4, line 48, after "printed on" change "a" to -- an --.

Column 11, line 40, change "stowed" to -- stored --.
Column 11, line 57, change "stowed" to -- stored --.

Column 13, line 33, after "FIGS." insert -- 1 --.

Column 13, lines 67,68, delete "circuits tester has electronic circuit board verification".

Column 16, line 3, change "brining" to -- bringing --.
Column 16, line 29, before "spring" delete "and".
Column 16, line 35, after "independently of" change "an" to -- and --.

UNITED STATES PATENT AND TRADEMARK OFFICE
CERTIFICATE OF CORRECTION

PATENT NO. : 5,270,641
DATED : December 14, 1993
INVENTOR(S) : David R. Van Loan; Charles J. Johnston;
Mark A. Swart; David J. Wilkie It is certified that error appears in the above-indentified patent and that said Letters Patent is hereby corrected as shown below:

Column 17, line 58, after "upper" insert -- test probes and aligned with corresponding contacts in the upper --.

Column 19, lines 1,2, delete "signals sent from the upper test probes are sent to the test".

Column 19, line 14, change "plate" to -- place --.

Signed and Sealed this

Twentieth Day of September, 1994

Attest:

BRUCE LEHMAN

*Attesting Officer*     *Commissioner of Patents and Trademarks*